United States Patent

Arakawa et al.

[11] Patent Number: 5,994,212
[45] Date of Patent: Nov. 30, 1999

[54] SEMICONDUCTOR DEVICE AND METHOD OF MANUFACTURING THE SAME

[75] Inventors: Sadayoshi Arakawa; Seiichi Ito; Kenichi Nishiyama; Koei Maruyama, all of Niigata, Japan

[73] Assignee: Matsushita Electronics Corporation, Osaka, Japan

[21] Appl. No.: 08/891,804

[22] Filed: Jul. 14, 1997

[30] Foreign Application Priority Data

Jul. 15, 1996 [JP] Japan .................................. 8-184615

[51] Int. Cl.[6] .................................................. H01L 21/44
[52] U.S. Cl. .......................... 438/617; 438/123; 257/673; 257/666
[58] Field of Search ..................................... 430/617, 111, 430/123; 257/666, 673, 676, 671; 29/827; 216/14; 361/723, 813

[56] References Cited

U.S. PATENT DOCUMENTS

| | | | |
|---|---|---|---|
| 4,707,418 | 11/1987 | Takiar et al. | 438/123 |
| 4,821,148 | 4/1989 | Kobayashi et al. | 438/123 |
| 4,908,933 | 3/1990 | Sagisaka et al. | 29/827 |
| 5,138,431 | 8/1992 | Huang et al. | 257/677 |
| 5,221,428 | 6/1993 | Ohsawa et al. | 29/827 |
| 5,359,223 | 10/1994 | Nakamori | 257/666 |
| 5,492,233 | 2/1996 | Kusagaya | 216/14 |
| 5,683,943 | 11/1997 | Yamada | 29/827 |
| 5,684,379 | 11/1997 | Serizawa | 257/666 |
| 5,735,030 | 4/1998 | Orcutt | 29/827 |
| 5,801,436 | 9/1998 | Serizawa | 257/666 |

FOREIGN PATENT DOCUMENTS

62136838 10/1985 Japan.
63078541 9/1986 Japan.

*Primary Examiner*—Kevin M. Picardat
*Attorney, Agent, or Firm*—McDermott, Will & Emery

[57] ABSTRACT

A semiconductor chip is bonded onto a die pad portion of a lead frame including nickel/palladium/gold stacked plate layers. Then, a first bonding procedure is carried out with a metal wire of gold pressed against an electrode pad of the semiconductor chip while applying a load of approximately 60 g and ultrasonic waves with a power of approximately 55 mW by using a bonding tool. Subsequently, a second bonding procedure is carried out with the metal wire pressed against an inner lead portion of the lead frame while applying a load of 150 through 250 g and the ultrasonic waves with a power of 0 through 20 mW. In the second bonding procedure, the wire bonding in conformity with the property of the stacked plate layers can be conducted using a large load and a small ultrasonic power, resulting in attaining firm bonding in a short period of time without causing peeling of the gold plate layer.

19 Claims, 10 Drawing Sheets

SEMICONDUCTOR DEVICE AND METHOD OF MANUFACTURING THE SAME

BACKGROUND OF THE INVENTION

The present invention relates to a semiconductor device and a method of manufacturing the semiconductor device, in which stacked plate layers in a lead frame can be prevented from peeling in a wire bonding procedure so as to attain high reliability of the connection between a wire and the lead frame.

A recently developed lead frame includes stacked plate layers, which are formed by plating a plate-shaped body of copper (Cu) with nickel as underplate and plating the nickel-plated body with palladium (Pd) and further with gold (Au).

Now, a conventional semiconductor device utilizing the lead frame including such nickel/palladium/gold stacked plate layers will be described.

Figure 9:
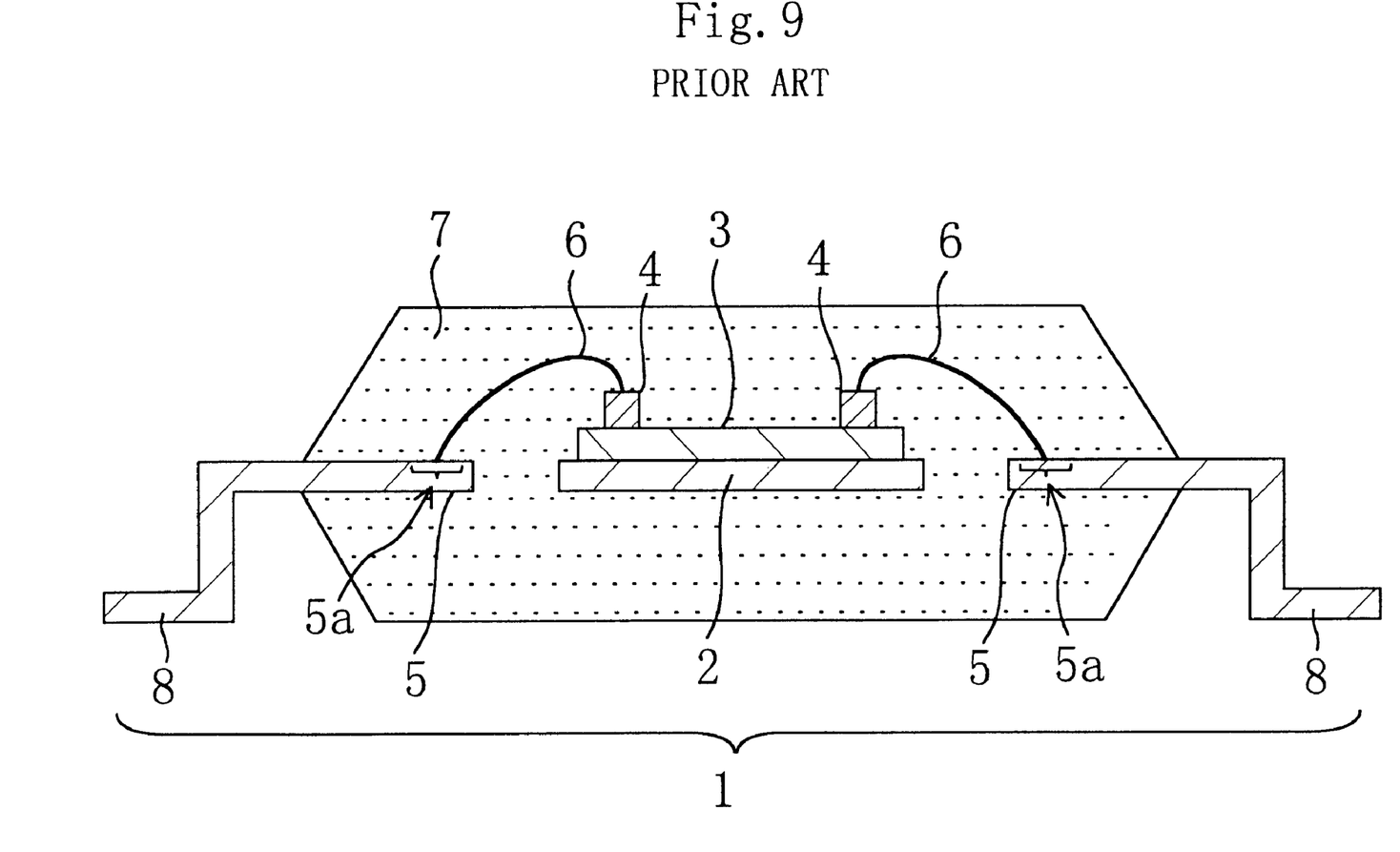
FIG. 9 is a sectional view for showing the structure of a conventional semiconductor device.

FIG. 9 is a sectional view for showing the structure of the conventional semiconductor device. As is shown in FIG. 9, the conventional semiconductor device comprises a lead frame 1 including a die pad portion 2, an inner lead portion 5 and an outer lead portion 8, a semiconductor chip 3 bonded and mounted onto the die pad portion 2 of the lead frame 1 with an adhesive agent such as silver paste, and a metal wire 6 for connecting an electrode 4 of the semiconductor chip 3 with a bonding area 5a of the inner lead portion 5 of the lead frame 1. The peripheral area of the semiconductor chip 3, namely, an area including the die pad portion 2, the inner lead portion 5, the semiconductor chip 3 and the metal wire 6, is sealed with a sealing resin 7, so that the outer lead portion 8 of the lead frame 1 projecting outward from the sealing resin 7 can be suitably connected with external equipment.

Next, a method of manufacturing the conventional semiconductor device will be described. FIGS. 10 through 13 are sectional views for showing the manufacturing procedures for the conventional semiconductor device.

Figure 10:
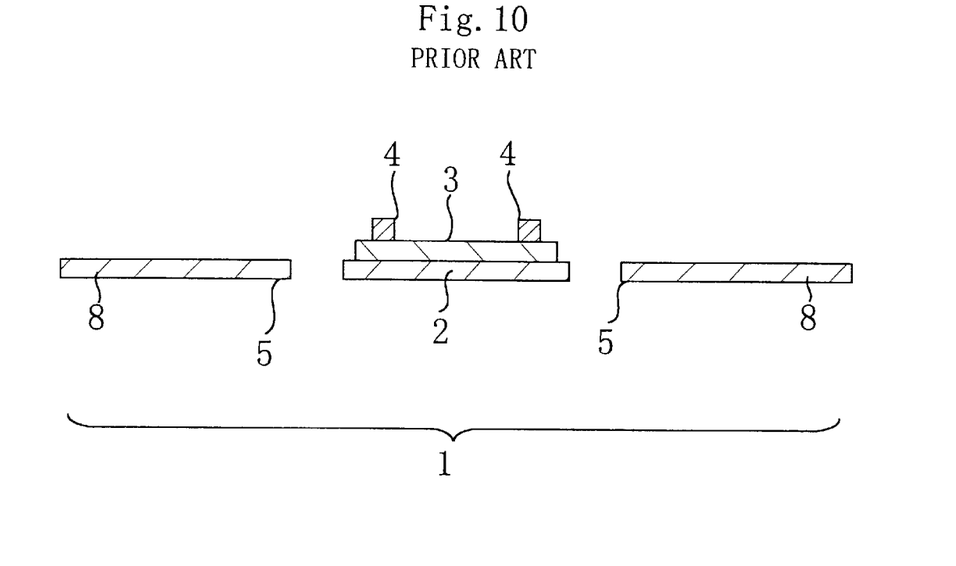
FIG. 10 is a sectional view for showing a die bonding procedure in the manufacture of the conventional semiconductor device.

First, as is shown in FIG. 10, the semiconductor chip 3 is bonded onto the die pad portion 2 of the lead frame 1 with the adhesive agent such as silver paste (which procedure is designated as a die bonding procedure).

Figure 11:
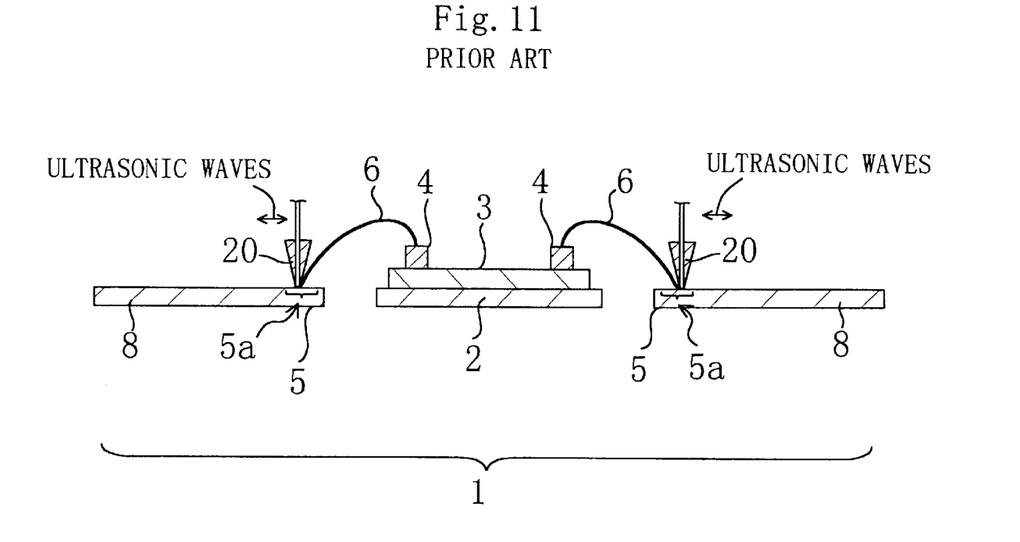
FIG. 11 is a sectional view for showing a wire bonding procedure in the manufacture of the conventional semiconductor device.

Then, as is shown in FIG. 11, the electrode 4 of the semiconductor chip 3 mounted on the die pad portion 2 is electrically connected with the inner lead portion 5 of the lead frame 1 through the metal wire 6 (which procedure is designated as a wire bonding procedure). This procedure is generally carried out by a nail head bonding method when a gold wire is used as the metal wire. Specifically, a wire bonder having a bonding tool 20 designated as a capillary is used, so that the metal wire 6 with a ball-like tip is pressed against and connected with the electrode 4 of the semiconductor chip 3 in a first bonding procedure and the metal wire 6 is successively pressed against and connected with the bonding area 5a of the inner lead portion 5 in a second bonding procedure. Through these two bonding procedures, the electrode 4 of the semiconductor chip 3 is electrically connected with the bonding area 5a of the inner lead portion 5 through the metal wire 6.

In this wire bonding procedure for connecting the electrode 4 with the bonding area 5a, the first bonding procedure is carried out under conditions of a ultrasonic power of 55 mW and a pressing load of 60 g and the second bonding procedure is carried out under conditions of a ultrasonic power of 90 through 100 mW and a pressing load of 100 g. The metal wire 6 generally has a diameter of approximately 30 through 35 $\mu$m.

Figure 12:
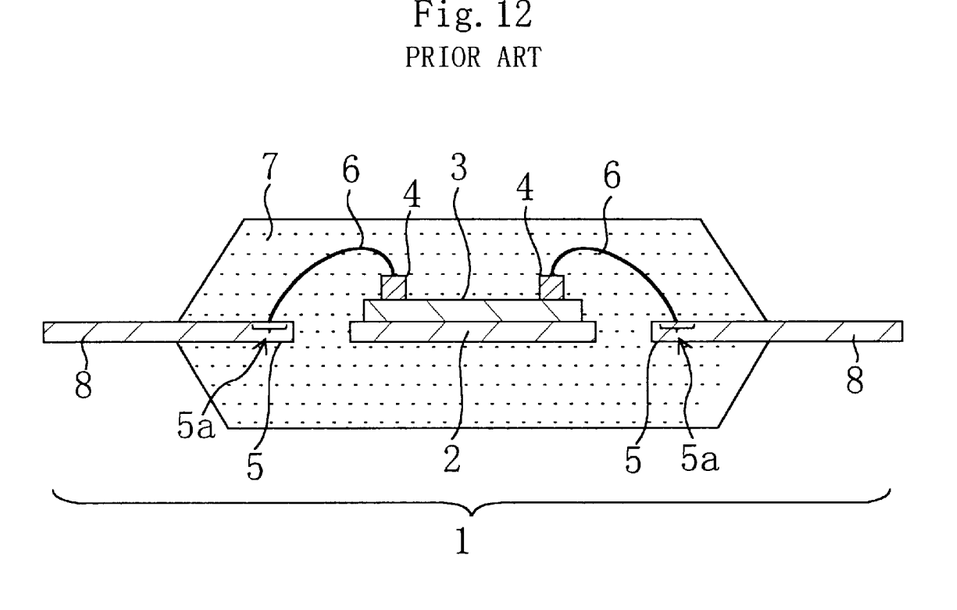
FIG. 12 is a sectional view for showing a resin sealing procedure in the manufacture of the conventional semiconductor device.

After completing the wire bonding procedure, the area including the die pad portion 2, the inner lead portion 5, the semiconductor chip 3 and the metal wire 6 is sealed with the sealing resin 7 as is shown in FIG. 12. This procedure is carried out by transfer molding with the lead frame 1 mounting the semiconductor chip 3 placed in a mold.

Figure 13:
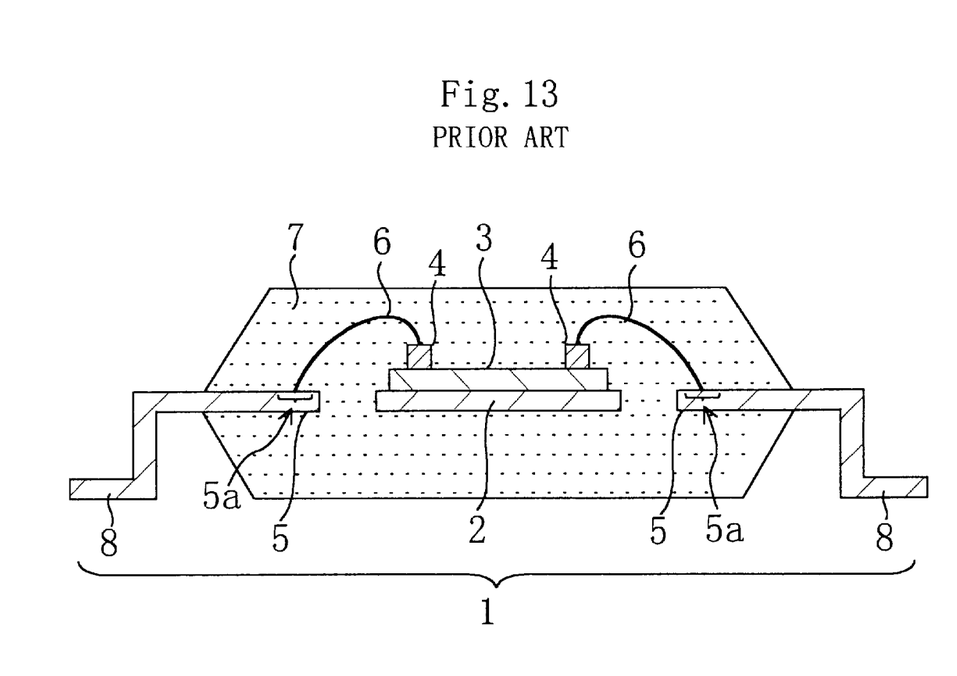
FIG. 13 is a sectional view for showing an outer lead shaping procedure in the manufacture of the conventional semiconductor device.

Ultimately, as is shown in FIG. 13, the outer lead portion 8 projecting outward from the sealing resin 7 is shaped. Thus, the conventional semiconductor device is manufactured.

Figure 14A:
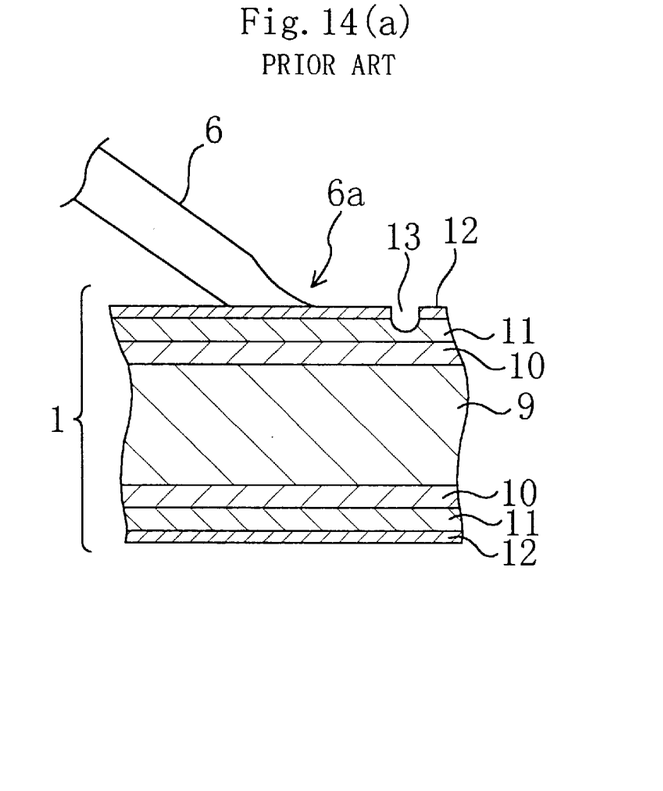
FIGS. 14(a) and 14(b) are enlarged sectional and perspective views of the vicinity of a bonding area of an inner lead portion formed in the manufacture of the conventional semiconductor device.
Figure 14B:
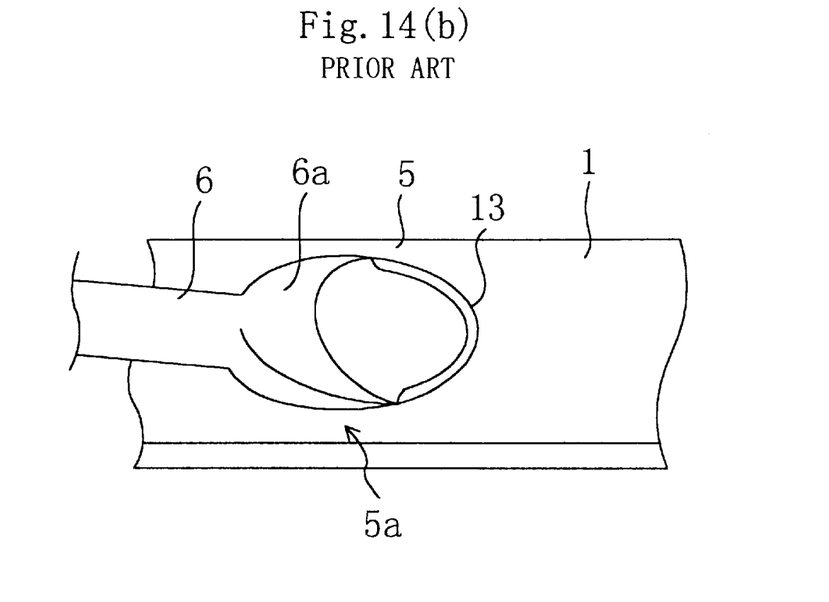

The semiconductor device manufactured through the conventional manufacturing procedures has, however, the following problem:

FIGS. 14(a) and 14(b) are enlarged sectional and perspective views, respectively, of the vicinity of the bonding area 5a of the inner lead portion 5 in the conventional semiconductor device. As is shown in FIG. 14(a), the lead frame 1 includes a nickel plate layer 10, a palladium plate layer 11 and a gold plate layer 12 successively stacked on a body 9 of copper. The nickel plate layer 10, the palladium plate layer 11 and the gold plate layer 12 have thicknesses of 0.5 $\mu$m, 0.03 $\mu$m and 0.002 $\mu$m, respectively.

At this point, as is shown in FIGS. 14(a) and 14(b), in the bonding area 5a of the inner lead portion 5, a peeled area 13 where the gold plate layer 12 is peeled is found to have been formed in a half circular shape around a tip portion 6a of the metal wire 6 where the metal wire 6 is pressed and cut with the bonding tool 20. The peeled area 13 can reach not only the palladium plate layer 11 but also the nickel plate layer 10 and the body 9 underneath. Due to the peeled area 13, the nickel plate layer 10 can be corroded and the strength in connection with the wire can be degraded. Additionally, a peeled plate material can be disadvantageously adhered to the bonding tool 20 of the wire bonder, so that the ball-like tip of a subsequent wire can be deformed in the subsequent wire bonding procedure (first bonding procedure). Thus, the peeled plate material can cause a wire bonding defect.

As a result of pursuit for the mechanism of causing the peeled area 13 in the second bonding procedure, it is estimated that the plate layer is peeled because the second bonding procedure is carried out with applying a larger ultrasonic power than in the first bonding procedure. Specifically, the current wire bonding procedure is carried out indispensably with applying the ultrasonic waves, the load and heat for instant and firm wire connection, so as to secure a high speed (mass production) and reliability in the connection. Furthermore, the gold plate layer has a thickness as small as possible (approximately 0.002 $\mu$m) for decrease in the manufacturing cost. When the electrode of the semiconductor chip is connected with the inner lead portion through the metal wire while applying the ultrasonic waves to the lead frame having such a structure by using the wire bonder, the ultrasonic vibration cannot be sufficiently absorbed within the thin gold plate layer. Therefore, a crack is formed in the boundary between the gold plate layer and the palladium plate layer, particularly the periphery of the area pressed with the bonding tool, so as to ultimately peel the plate layer.

SUMMARY OF THE INVENTION

The object of the invention is providing a semiconductor device and a method of manufacturing the semiconductor device, in which, in a wire bonding procedure for a lead frame having a stacked plate structure including an outermost layer of a soft material such as gold, a wire can be firmly bonded with the lead frame at high efficiency without peeling the outermost layer.

The present inventors have found that the ultrasonic power (in a unit of mW) of a bonding tool used in the wire bonding can peel a plate layer, and that, in particular, a soft plate material such as gold can be easily affected by the ultrasonic power.

Accordingly, means for achieving the aforementioned object is a structure where the ultrasonic waves can be absorbed by a plate layer in a bonding area of an inner lead portion, or alternatively is a method where a metal wire is bonded with the inner lead portion without using the ultrasonic waves or with applying a very small ultrasonic power.

The semiconductor device of this invention comprises a semiconductor chip having an electrode pad; a lead frame including at least an inner lead portion and an outer lead portion, the lead frame being made from a body of a metal and stacked plate layers formed on the body, an outermost layer of the stacked plate layers being made from a soft material; and a metal wire for connecting the electrode pad of the semiconductor chip with the lead frame, and the outermost layer of the stacked plate layers has a larger thickness in an area of the inner lead portion where the metal wire is connected than in another area.

In this manner, the outermost layer of the stacked plate layers has a larger thickness in the area of the inner lead portion where the metal wire is connected. Therefore, even when the ultrasonic power is applied in the wire bonding procedure, the vibration is absorbed by the outermost layer so as to prevent the peeling of the outermost layer.

In one aspect of the semiconductor device, the outermost layer of the stacked plate layers in the inner lead portion is preferably made from the same material as the metal wire.

In this manner, since the metal wire and the outermost layer of the stacked plate layers are made from the same soft material, the function to absorb the ultrasonic vibration can be enhanced, and the bonding can be eased.

In another aspect of the semiconductor device, the body of the inner lead portion is preferably made from a copper plate, the stacked plate layers of the inner lead portion are preferably formed by successively stacking a nickel plate layer, a palladium plate layer and a gold plate layer, and the metal wire is preferably made from a material including gold as a main component.

In this manner, a peeled area can be prevented from being formed in the inner lead portion including the palladium plate layer, which is poor in corrosiveness.

The first method of manufacturing a semiconductor device of this invention comprises a step of preparing a semiconductor chip having an electrode pad; a step of preparing a lead frame including an inner lead portion and an outer lead portion, the lead frame being made from a body of a metal and stacked plate layers formed on the body, an outermost layer of the stacked plate layers being made from a soft material; a first bonding step of bonding a metal wire onto the electrode pad with a tip of the metal wire placed on the electrode pad of the semiconductor chip, with applying a load and ultrasonic waves; and a second bonding step of bonding the metal wire onto the inner lead portion, with another part of the metal wire placed on the inner lead portion, with applying a load and no ultrasonic wave.

In this method, the metal wire and the inner lead portion can be connected with each other with applying a pressing load alone without using the ultrasonic waves in the second bonding procedure. Therefore, firm wire bonding can be realized in a short period of time without causing the peeling of the outermost layer of the stacked plate layers.

The second method of manufacturing a semiconductor device of this invention comprises a step of preparing a semiconductor chip having an electrode pad; a step of preparing a lead frame including an inner lead portion and an outer lead portion, the lead frame being made from a body of a metal and stacked plate layers, an outermost layer of the stacked plate layers being made from a soft material; a first bonding step of bonding a metal wire onto the electrode pad with a tip of the metal wire placed on the electrode pad of the semiconductor chip, with applying a load and ultrasonic waves; and a second bonding step of bonding the metal wire onto the inner lead portion with another part of the metal wire placed on the inner lead portion, with applying a load larger than in the first bonding step and ultrasonic waves with a smaller power than in the first bonding step.

In this method, since the ultrasonic power used in the second bonding procedure is extremely small, the peeling of the outermost layer of the stacked plate layers, which is caused due to the ultrasonic waves with a larger power than in the first bonding procedure in the conventional manufacturing method, can be avoided.

In the second method of manufacturing a semiconductor device, the first bonding step is preferably carried out at a ultrasonic power of approximately 55 mW and a load of approximately 60 g, and the second bonding step is preferably carried out at a ultrasonic power of 0 through 20 mW and a load of 150 through 250 g.

Furthermore, in the first and second methods of manufacturing a semiconductor device, the metal wire used in the first and second bonding steps is preferably made from the same material as that for the outermost layer of the stacked plate layers.

In one aspect of these methods, the stacked plate layers are preferably formed by successively stacking a nickel plate layer, a palladium plate layer and a gold plate layer on the body made from a copper plate in the step of preparing the lead frame, and the metal wire used in the first and second bonding steps is preferably made from a material including gold as a main component.

The second bonding step is preferably carried out at a temperature of 150 through 300° C.

Also, the outermost layer of the plate layers can be allowed to have a larger thickness in an area of the inner lead portion where the metal wire is connected.

In this manner, even when the ultrasonic waves are applied to the connection between the inner lead portion and the metal wire in the second bonding procedure, the ultrasonic vibration can be absorbed by the outermost layer of the stacked plate layers, so as to prevent the peeling.

The third method of manufacturing a semiconductor device of this invention comprises a step of preparing a semiconductor chip having an electrode pad; a step of preparing a lead frame including an inner lead portion and an outer lead portion and formed by successively stacking a nickel plate layer, a palladium plate layer and a gold plate layer on a body of a metal; a first bonding step of bonding the electrode pad with a metal wire made from a material including gold as a main component, with a tip of the metal wire placed on the electrode pad of the semiconductor chip, with applying a load and ultrasonic waves; and a second bonding step of bonding the metal wire onto the inner lead portion with another part of the metal wire placed on the inner lead portion, with applying a load of 150 through 250 g and ultrasonic waves with a power of 0 through 20 mW.

In this method, the power of the ultrasonic waves used in the second bonding procedure is very small. Therefore, the wire bonding can be realized without peeling the outermost gold plate layer of the stacked plate layers and exposing the easily corrodible palladium plate layer or without exposing the nickel plate layer and the body of the lead frame therebelow. In addition, by applying such a large load, the bonding in conformity with the property of the entire stacked plate layers including the nickel plate layer, the palladium plate layer and the gold plate layer can be realized, a high strength in the connection can be attained in a short period of time, and the resultant semiconductor device can attain high reliability.

In the third method of manufacturing a semiconductor device can further comprises, after the first and second bonding steps, a step of sealing the semiconductor chip, the metal wire and the inner lead portion with a resin.

In this manner, the inner lead portion, which is housed in a resin sealing package with a low manufacturing cost and can be easily corroded due to a water content included in the sealing resin, can be free from corrosion derived from a peeled area. In this manner, an inexpensive and reliable semiconductor device can be manufactured.

In one aspect of the method of manufacturing a semiconductor device, the second bonding step is preferably carried out at a temperature of 150 through 300° C.

In this manner, the second bonding procedure can be carried out at a comparatively low annealing temperature which is suitable to the property of the entire stacked plate layers including the nickel plate layer, the palladium plate layer and the gold plate layer. Thus, the bonding with high reliability can be attained in a short period of time.

In another aspect of the method of manufacturing a semiconductor device, the second bonding step can be carried out at a ultrasonic power of 0 mW.

DETAILED DESCRIPTION OF THE INVENTION

Embodiment 1

A first embodiment of the invention will now be described with reference to FIG. 1, which is a sectional view for showing the structure of a semiconductor device of this embodiment.

Figure 1:
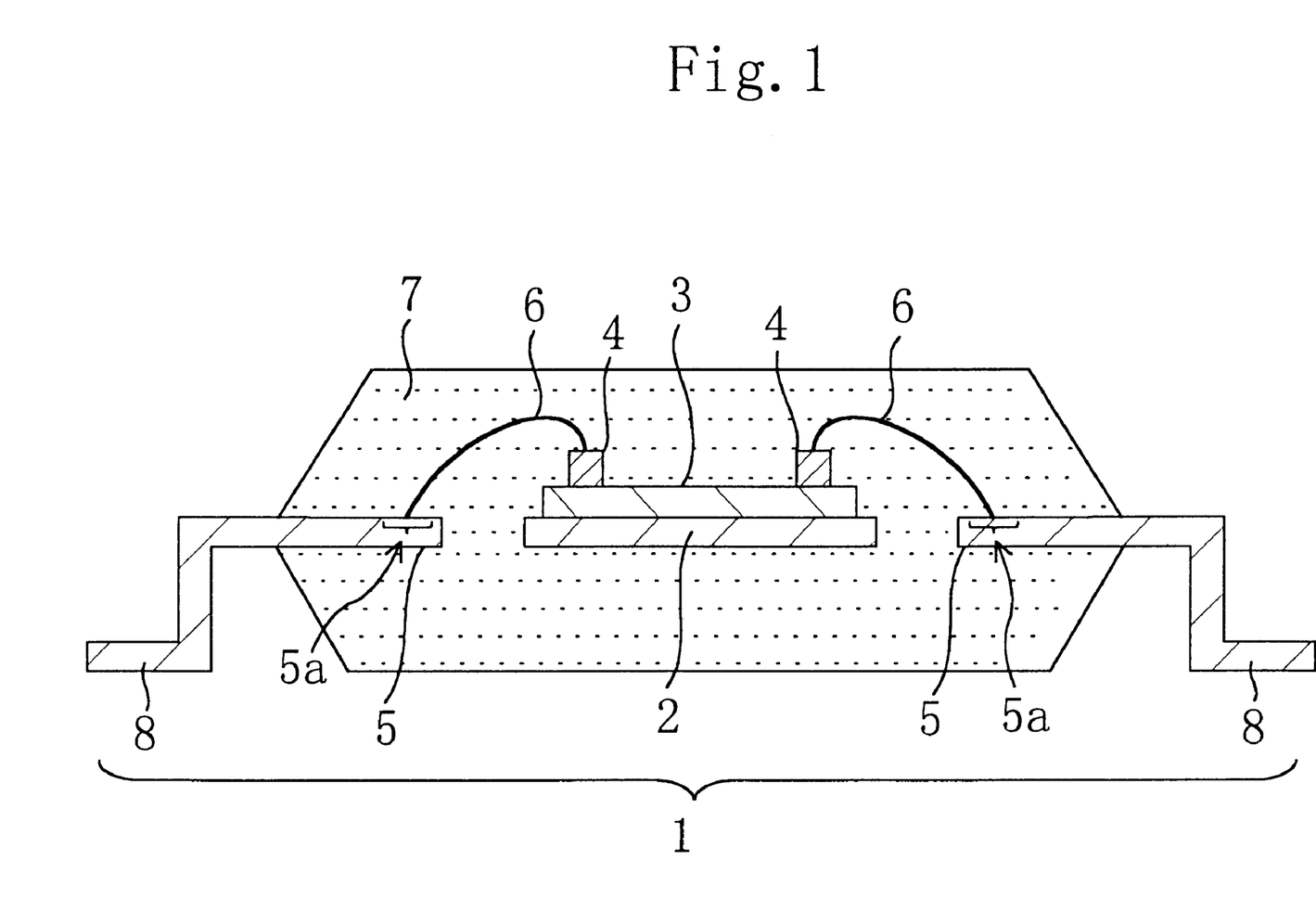
FIG. 1 is a sectional view for showing the structure of a semiconductor device according to a first embodiment.

As is shown in FIG. 1, the semiconductor device of this embodiment comprises a semiconductor chip 3 bonded with an adhesive agent such as silver paste to be mounted on a die pad portion 2 of a lead frame 1, and an electrode 4 of the semiconductor chip 3 is electrically connected with an inner lead portion 5 of the lead frame 1 through a metal wire 6. The semiconductor chip 3, the metal wire 6 and the inner lead portion 5 of the lead frame 1 are sealed with a sealing resin 7, and an outer lead portion 8 projecting outward from the sealing resin 7 is shaped.

As a characteristic of the semiconductor device of this embodiment, a bonding area 5a of the inner lead portion 5 of the lead frame 1, which is an area where the metal wire 6 is bonded in a wire bonding procedure, has a plate layer with a larger thickness. This characteristic will now be described in detail.

Figure 2:
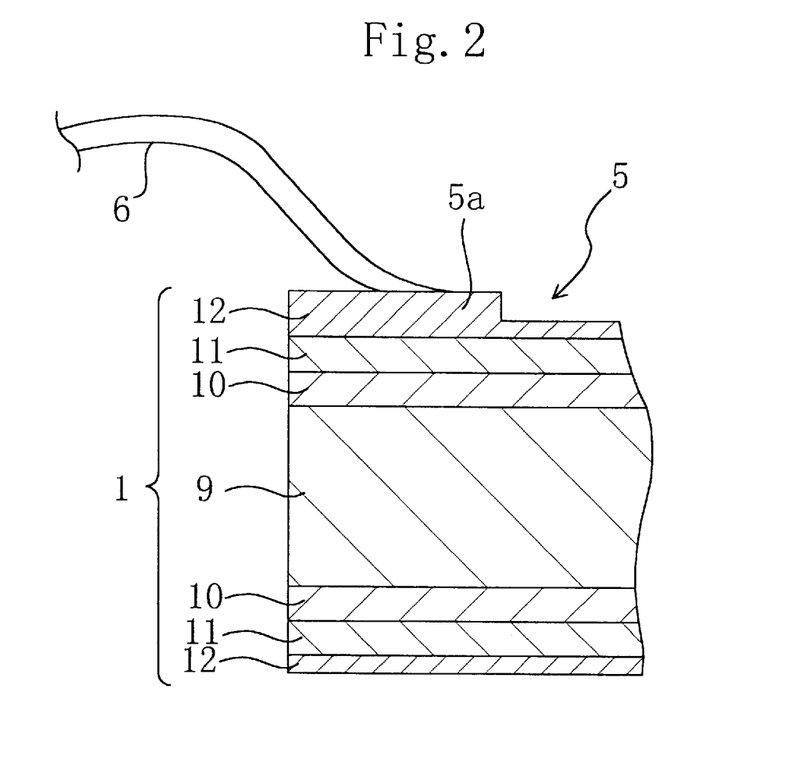
FIG. 2 is an enlarged sectional view of the vicinity of a bonding area of an inner lead portion in the semiconductor device of the first embodiment.

FIG. 2 is a sectional view for showing the connection between the inner lead portion 5 and the metal wire 6 in the vicinity of the bonding area 5a of the inner lead portion 5. As is shown in FIG. 2, the lead frame 1 of this embodiment includes a body 9 made from a copper plate and plate layers formed on the body 9, i.e., a nickel plate layer 10, a palladium plate layer 11 and a gold plate layer 12. In this lead frame 1, the gold plate layer 12 has a larger thickness in the bonding area 5a of the inner lead portion 5. For example, the gold plate layer 12 has a thickness of approximately 0.03 $\mu$m in the bonding area 5a while it has a thickness of approximately 0.002 $\mu$m in another area. In connecting the electrode 4 of the semiconductor chip 3 with the inner lead portion 5 through the metal wire 6 of gold, even when ultrasonic waves of a bonding tool of a wire bonder are applied to this bonding area 5a of the inner lead portion 5, the ultrasonic vibration can be absorbed to some extent because the outermost gold plate layer 12 is thus thick. Therefore, the gold plate layer 12 can be prevented from peeling or merely a surface area thereof is peeled. Accordingly, the palladium plate layer 12 and the nickel plate layer 10 underneath can be prevented from being exposed in the wire bonding procedure, and the strength of the wire connection can be prevented from being degraded due to the peel of the outermost layer.

In this embodiment, the nickel plate layer 10 and the palladium plate layer 11 have thicknesses of 0.5 μm and 0.03 μm, respectively, which does not limit the invention. Also, the gold plate layer 12 of this embodiment has a thickness of 0.03 μm in the bonding area 5a and 0.002 μm in another area, which also does not limit the invention.

Embodiment 2

A method of manufacturing a semiconductor device according to a second embodiment will now be described with reference to FIGS. 3 through 6, which are sectional views for showing the manufacturing procedures for the semiconductor device of this embodiment.

Figure 3:
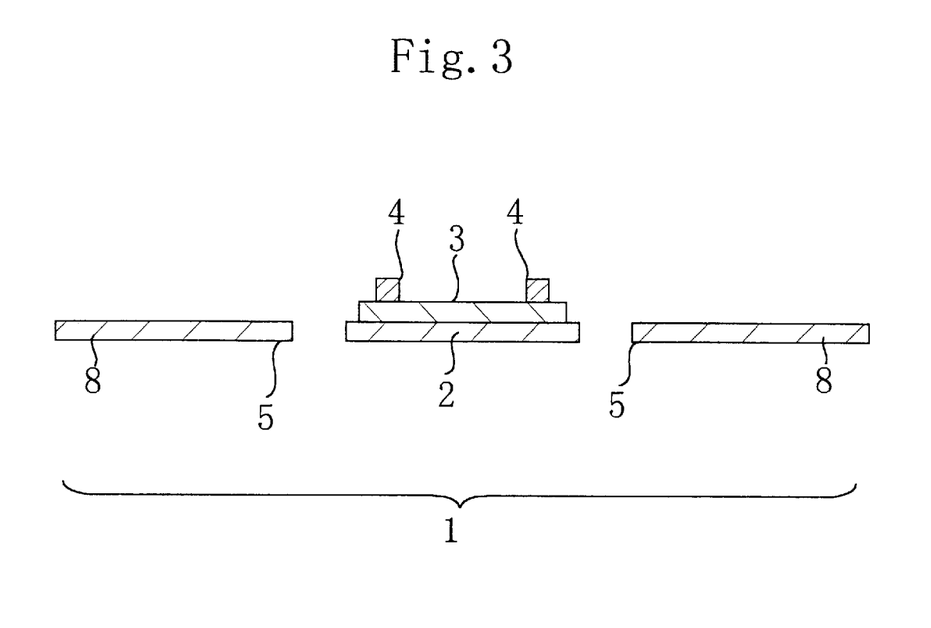
FIG. 3 is a sectional view for showing a die bonding procedure in the manufacture of a semiconductor device according to a second embodiment.

First, in the procedure shown in FIG. 3, a lead frame 1 including a die pad portion 2, an inner lead portion 5 and an outer lead portion 8 is prepared. Although the detailed section of the lead frame 1 is not shown, the lead frame 1 of this embodiment has substantially the same structure as that of the first embodiment shown in FIG. 2, namely, the lead frame 1 includes a body made from a copper plate and a nickel plate layer, a palladium plate layer and a gold plate layer formed thereon. Differently from the first embodiment, the gold plate layer, i.e., the outermost layer, of this embodiment has substantially a uniform thickness in the entire area and does not particularly have a larger thickness in a bonding area 5a. The thicknesses of the nickel plate layer, the palladium plate layer and the gold plate layer are 0.5 μm, 0.03 μm and 0.002 μm, respectively. On the die pad portion 2 of the lead frame 1 having such a structure, a semiconductor chip 3 is bonded with an adhesive agent such as silver paste.

Figure 4:
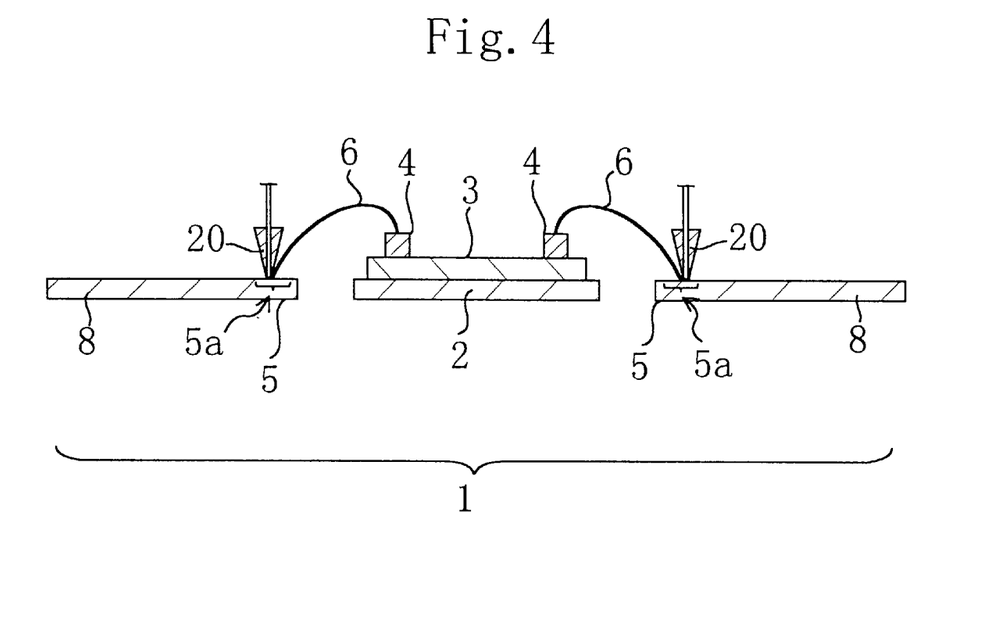
FIG. 4 is a sectional view for showing a wire bonding procedure in the manufacture of the semiconductor device of the second embodiment.

Next, in the procedure shown in FIG. 4, an electrode 4 of the semiconductor chip 3 mounted on the die pad portion 2 is electrically connected with the inner lead portion 5 of the lead frame 1 through a metal wire 6 of gold. This procedure is carried out, similarly to the conventional wire bonding procedure, by the nail head bonding using a wire bonder (not shown) having a bonding tool 20 designated as a capillary. The metal wire 6 has a diameter of approximately 25 through 35 μm. The wire bonding procedure generally includes a first bonding procedure for connecting one end of the metal wire 6 with the electrode 4 of the semiconductor chip 3 and a second bonding procedure for connecting the other end of the metal wire 6 with the inner lead portion 5 of the lead frame 1.

In this case, in the first bonding procedure, the end (generally in a ball-like shape) of the metal wire 6 is pressed against the electrode 4 of the semiconductor chip 3 with a load of approximately 60 g with the bonding tool 20 while applying the ultrasonic waves, so that the metal wire 6 can be bonded with the semiconductor chip 3.

In the second bonding procedure, a part of the metal wire 6 whose one end is connected with the electrode 4 of the semiconductor chip 3 is pressed against the bonding area 5a of the inner lead portion 5 with the bonding tool 20. At this point, no ultrasonic wave is applied or alternatively the power of the applied ultrasonic waves is suppressed to be as small as 20 mW or less, and a load of approximately 200 g, which is larger than that in the first embodiment, is applied. This is a characteristic of the method of manufacturing the semiconductor device of this embodiment. Through this pressing load and annealing, the metal wire 6 is connected with the inner lead portion 5 and is cut with the edge of the bonding tool 20.

Figure 5:
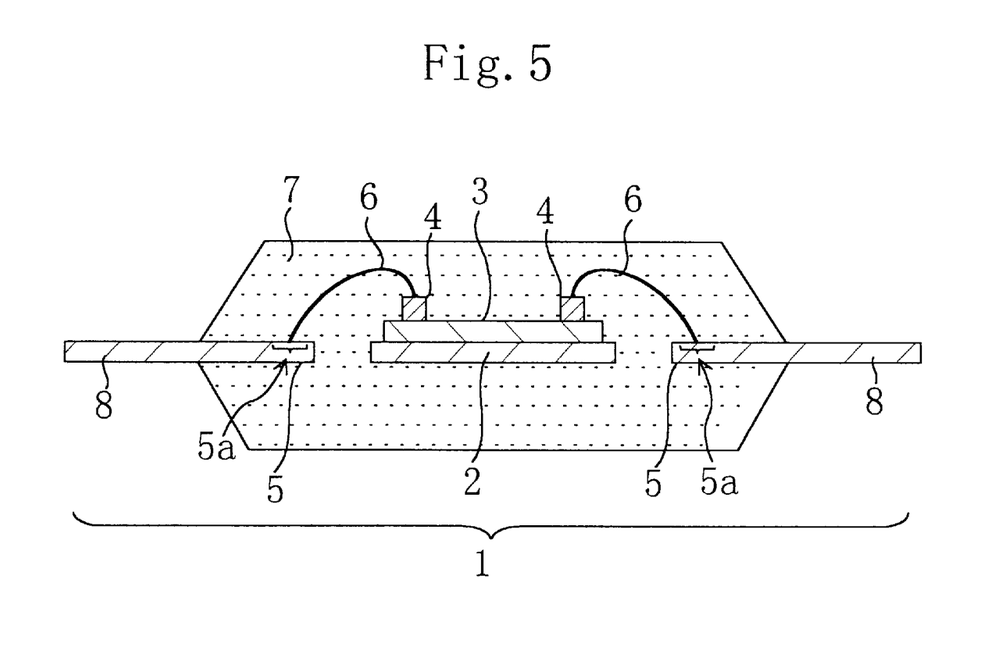
FIG. 5 is a sectional view for showing a resin sealing procedure in the manufacture of the semiconductor device of the second embodiment.

Next, in the procedure shown in FIG. 5, after completing the above-described respective bonding procedures, the semiconductor chip 3, the metal wire 6, and the die pad portion 2 and the inner lead portion 5 of the lead frame 1 are sealed with a sealing resin 7. This procedure is carried out by the transfer molding with the lead frame 1 mounting the semiconductor chip 3 placed in a mold. Then, a part of the lead frame 1 outside of the sealing resin 7 is cut off so as to be separated from the outer lead portion 8.

Figure 6:
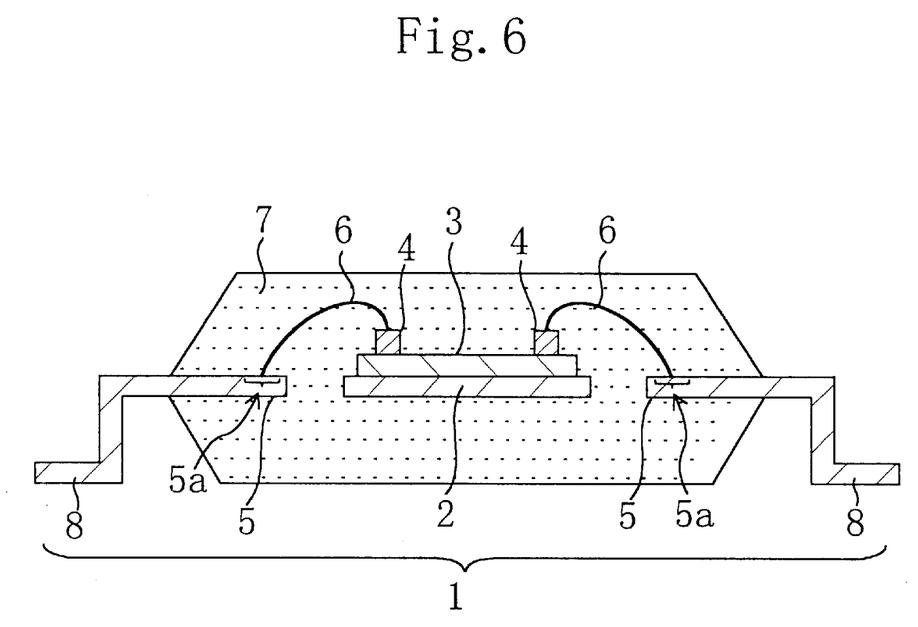
FIG. 6 is a sectional view for showing an outer lead shaping procedure in the manufacture of the semiconductor device of the second embodiment.

Ultimately, in the procedure shown in FIG. 6, the outer lead portion 8 projecting outward from the sealing resin 7 is shaped, thereby completing the semiconductor device.

As described above, in the method of manufacturing the semiconductor device of this embodiment, the first bonding procedure is carried out under the conditions of a ultrasonic power of 55 mW and a pressing load of 60 g, whereas the second bonding procedure is carried out under the conditions of the ultrasonic power of 0 through 20 mW and the pressing load of approximately 200 g. By adopting these conditions largely different from those for the conventional wire bonding procedure, the plate layers formed on the lead frame 1 can be prevented from peeling. In particular, when the metal wire 6 is made of the same soft material as the outermost plate layer of the lead frame 1, the strength of the connection between the metal wire and the inner lead portion can be further increased.

Figure 7A:
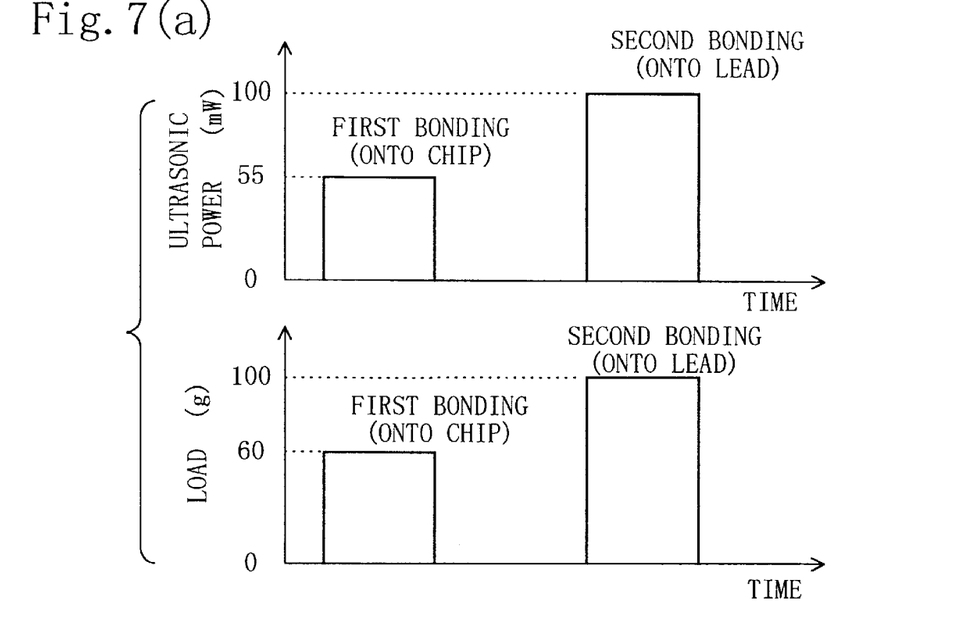
FIGS. 7(a) and 7(b) are diagrams for comparing conditions for the wire bonding procedure in the manufacture of the semiconductor device of the second embodiment with those for a conventional wire bonding procedure.
Figure 7B:
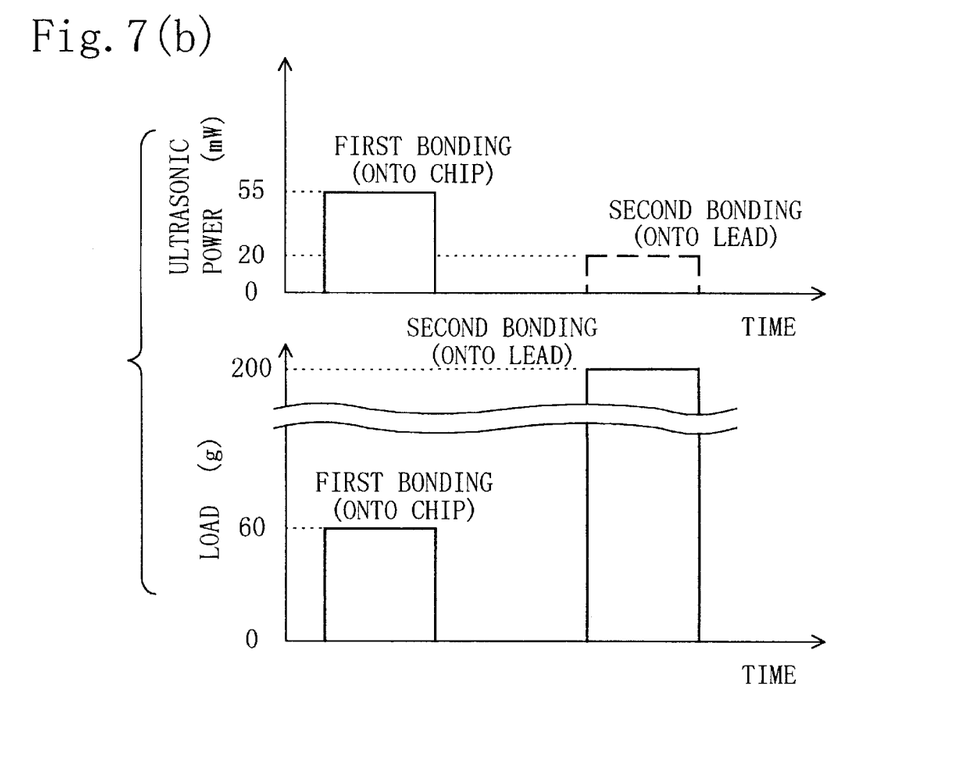

FIGS. 7(a) and 7(b) are diagrams for showing comparison in the ultrasonic power and the pressing load of the bonding tool between the wire bonding procedure of this embodiment and the conventional wire bonding procedure, wherein FIG. 7(a) shows the conditions for the conventional procedure and FIG. 7(b) shows those for the present procedure.

In the first bonding procedure, i.e., the procedure for bonding the metal wire onto the semiconductor chip, the conditions for the present procedure are the same as those for the conventional procedure. In the second bonding procedure, i.e., the procedure for bonding the metal wire onto the lead frame, however, the ultrasonic power is one fifth or less and the pressing load is approximately twice in this embodiment as compared with in the conventional procedure. The ultrasonic power adopted in the second bonding procedure is not always required to be 0 mW. For example, at the ultrasonic power of approximately 10 mW or of a value extremely close to 0 mW, the metal wire can be bonded without causing the peeling of the outermost gold plate layer as far as the ultrasonic power does not exceed 20 mW.

Now, the reason why the method of this embodiment can realize the second bonding procedure for bonding the metal wire 6 with the inner lead portion 5 without forming the conventionally formed peeled area 13 shown in FIGS. 14(a) and 14(b) will be examined. In the wire bonding, the ultrasonic power works to slide the metal wire on a substance to be connected, and the load and the heat work to thermally compress the metal wire with the substance to be connected. The annealing temperature is generally approximately 200° C. By appropriately combining these conditions, it is possible to realize a fast bonding procedure, in which one bonding requires 5 msec. and the entire bonding procedure requires approximately 15 msec. However, the reason why the second bonding procedure of this embodiment can realize firm bonding without causing the peeling of the outermost plate layer in a short period of time of 15 msec. has not been sufficiently elucidated. The present invention has, however, revealed an experimental fact that such conditions of the large load and the comparatively low annealing temperature are in good conformity with the property of the entire stacked plate layers of nickel/palladium/gold. The following experimental facts are also incidentally confirmed:

For example, in the case where the ultrasonic power is set at 0 mW and the annealing temperature is set at approximately 250° C. in the second bonding procedure, the pressing load can be smaller than 200 g. Furthermore, in the case where the ultrasonic power is set at 20 mW and the annealing temperature is set at 180° C., the pressing load is preferably set at a value exceeding 200 g. It is noted that a higher annealing temperature can shorten the bonding time.

Now, the bonding conditions for the second bonding procedure attained through the experiments carried out for achieving the present invention will be summarized. The ultrasonic power is preferably not applied or is preferably in the range between 0 and 20 mW. The pressing load is preferably in the range between 150 and 250 g. The annealing temperature is preferably in the range between 150 and 300° C. In these experiments, a gold wire with a diameter of approximately 25 through 35 μm is used as the metal wire, and three layers of nickel, palladium and gold respectively having the aforementioned thicknesses are used as the stacked plate layers.

Figure 8A:
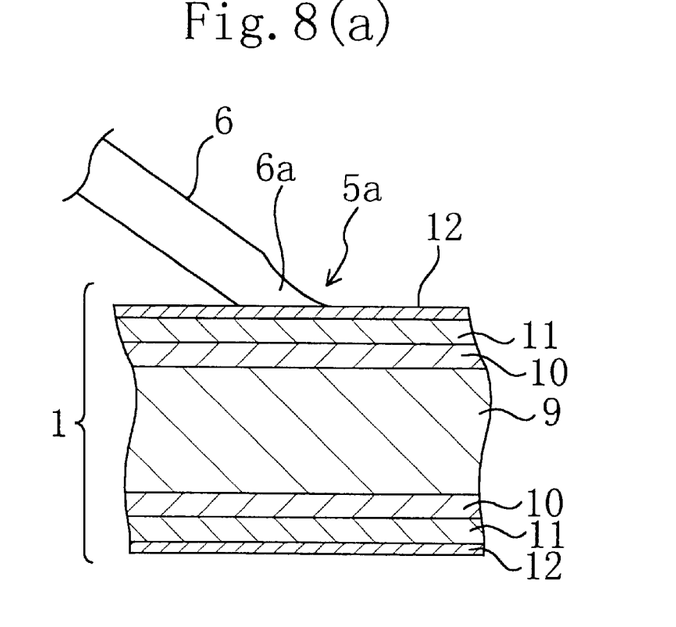
FIGS. 8(a) and 8(b) are enlarged sectional and perspective views of the vicinity of a bonding area of an inner lead portion formed in the manufacture of the semiconductor device of the second embodiment.
Figure 8B:
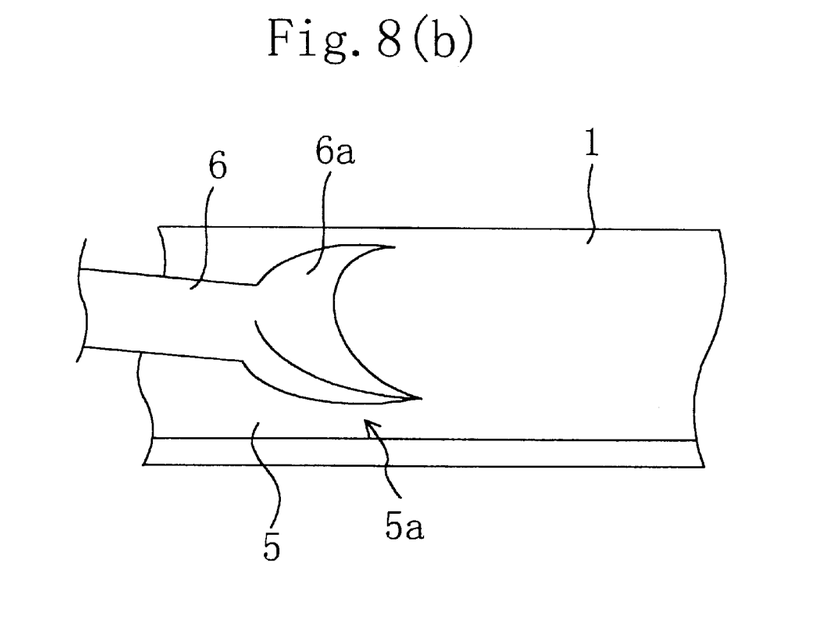

FIGS. 8(a) and 8(b) are sectional and perspective views, respectively of the vicinity of the bonding area 5a of the inner lead portion 5 resulting from the second bonding procedure conducted under conditions of the ultrasonic power of 0 mW and the pressing load of 200 g. As is shown in FIGS. 8(a) and 8(b), the ring-shaped peeled area 13, which is shown in FIGS. 14(a) and 14(b), cannot be observed around the bonding area 5a obtained by the method of this embodiment. In other words, a tip portion 6a of the metal wire 6 is bonded without peeling the outermost gold plate layer 12 of the inner lead portion 5 of the lead frame 1. There is no need to say that the copper plate of the body 9 is not exposed and that the nickel plate layer 10 and the palladium plate layer 11 are neither exposed nor peeled. In this manner, none of the plate layers is peeled, and hence, the strength of the wire connection can be stabilized. Furthermore, since the plate layers are not peeled, the plate materials do not adhere to the bonding tool. Therefore, the ball-shaped tip of a subsequent metal wire can be prevented from being deformed in the subsequent wire bonding procedure, i.e., the subsequent first bonding procedure.

Although not shown in the drawings, in the method of manufacturing a semiconductor device of the second embodiment, the wire bonding can be attained, while preventing the exposure of the lower plate layers derived from the peeling of the gold plate layer 12, also as follows: The gold plate layer 12 of the lead frame 1 is allowed to have a larger thickness in the bonding area 5a of the inner lead portion 5, and the second bonding procedure (the procedure for bonding the metal wire onto the inner lead portion) of the wire bonding procedure is carried out while applying the ultrasonic power of 0 through 20 mW. Also in this manner, the strength of the connection can be effectively stabilized.

The stacked plate layers are not necessarily required to include the three layers of nickel, palladium and gold as described herein. The effects of the invention can be exhibited as far as the outermost layer of the stacked plate layers is of a soft material, in particular, of the same material as that for the metal wire. In such a case, even when the ultrasonic power of the bonding tool of the wire bonder is set at a very small value, the soft material of the outermost layer of the stacked plate layers can be bonded with the metal wire by applying a pressing load in a very short period of time, and in addition, the structure of the outermost layer cannot be damaged. Accordingly, a wire can be bonded onto the lead frame having the stacked plate structure with high reliability while preventing the peeling of the plate layers in the wire bonding procedure.

What is claimed is:

1. A method of manufacturing a semiconductor device comprising:

a step of preparing a semiconductor chip having an electrode pad;

a step of preparing a lead frame including an inner lead portion and an outer lead portion, said lead frame being made from a body of a metal and stacked plate layers formed on said body, an outermost layer of said stacked plate layers being made from a soft material;

a first bonding step of bonding a metal wire onto said electrode pad with a tip of said metal wire placed on said electrode pad of said semiconductor chip, with applying a load and ultrasonic waves; and a second bonding step of bonding said metal wire onto said inner lead portion, with another part of said metal wire placed on said inner lead portion, with applying a load and no ultrasonic wave.

2. The method of manufacturing a semiconductor device of claim 1, wherein said metal wire used in said first and second bonding steps is made from the same material as said outermost layer of said stacked plate layers.

3. The method of manufacturing a semiconductor device of claim 1, wherein said stacked plate layers are formed by successively stacking a nickel plate layer, a palladium plate layer and a gold plate layer on said body made from a copper plate in said step of preparing said lead frame, and said metal wire used in said first and second bonding steps is made from a material including gold as a main component.

4. The method of manufacturing a semiconductor device of claim 1, wherein said second bonding step is carried out at a temperature of 150 through 300° C.

5. The method of manufacturing a semiconductor device of claim 1, wherein said outermost layer of said plate layers is allowed to have a larger thickness in an area of said inner lead portion where said metal wire is connected in said step of preparing said lead frame.

6. A semiconductor device comprising:

a semiconductor chip having an electrode pad;

a lead frame including at least an inner lead portion and an outer lead portion, said lead frame being made from a body of a metal and stacked plate layers formed on said body, an outermost layer of said stacked plate layers being made from a soft material; and a metal wire for connecting said electrode pad of said semiconductor chip with said lead frame, wherein said outermost layer of said stacked plate layers has a larger thickness in an area of said inner lead portion where said metal wire is connected than in another area.

7. The semiconductor device of claim 6, wherein said outermost layer of said stacked plate layers in said inner lead portion is made from the same material as said metal wire.

8. The semiconductor device of claim 6, wherein said body of said inner lead portion is made from a copper plate, said stacked plate layers of said inner lead portion are formed by successively stacking a nickel plate layer, a palladium plate layer and a gold plate layer, and said metal wire is made from a material including gold as a main component.

9. A method of manufacturing a semiconductor device comprising:

a step of preparing a semiconductor chip having an electrode pad;

a step of preparing a lead frame including an inner lead portion and an outer lead portion, said lead frame being made from a body of a metal and stacked plate layers, an outermost layer of said stacked plate layers being made from a soft material;

a first bonding step of bonding a metal wire onto said electrode pad with a tip of said metal wire placed on said electrode pad of said semiconductor chip, with applying a load and ultrasonic waves; and a second bonding step of bonding said metal wire onto said inner lead portion with another part of said metal wire placed on said inner lead portion, with applying a load larger than in said first bonding step and ultrasonic waves with a smaller power than in said first bonding step.

10. The method of manufacturing a semiconductor device of claim 9, wherein said first bonding step is carried out at a ultrasonic power of approximately 55 mW and a load of approximately 60 g, and said second bonding step is carried out at a ultrasonic power of 0 through 20 mW and a load of 150 through 250 g.

11. The method of manufacturing a semiconductor device of claim 9, wherein said metal wire used in said first and second bonding steps is made from the same material as that for said outermost layer of said stacked plate layers.

12. The method of manufacturing a semiconductor device of claim 9, wherein said stacked plate layers are formed by successively stacking a nickel plate layer, a palladium plate layer and a gold plate layer on said body made from a copper plate in said step of preparing said lead frame, and said metal wire used in said first and second bonding steps is made from a material including gold as a main component.

13. The method of manufacturing a semiconductor device of claim 9, wherein said second bonding step is carried out at a temperature of 150 through 300° C.

14. The method of manufacturing a semiconductor device of claim 9, wherein said outermost layer of said plate layers is allowed to have a larger thickness in an area of said inner lead portion where said metal wire is connected.

15. The method of manufacturing a semiconductor device of claim 9, wherein said second bonding step is carried out at a ultrasonic power of 0 through 20 mw and a load of 150 through 250 g.

16. A method of manufacturing a semiconductor device comprising:

a step of preparing a semiconductor chip having an electrode pad;

a step of preparing a lead frame including an inner lead portion and an outer lead portion and formed by successively stacking a nickel plate layer, a palladium plate layer and a gold plate layer on a body of a metal;

a first bonding step of bonding said electrode pad with a metal wire made from a material including gold as a main component, with a tip of said metal wire placed on said electrode pad of said semiconductor chip, with applying a load and ultrasonic waves; and a second bonding step of bonding said metal wire onto said inner lead portion with another part of said metal wire placed on said inner lead portion, with applying a load of 150 through 250 g and ultrasonic waves with a power of 0 through 20 mW.

17. The method of manufacturing a semiconductor device of claim 16, further comprising, after said first and second bonding steps, a step of sealing said semiconductor chip, said metal wire and said inner lead portion with a resin.

18. The method of manufacturing a semiconductor device of claim 16, wherein said second bonding step is carried out at a temperature of 150 through 300° C.

19. The method of manufacturing a semiconductor device of claim 16, wherein said second bonding step is carried out at a ultrasonic power of 0 mW.

* * * * *